(12) United States Patent
Brooks et al.

(10) Patent No.: US 7,248,484 B2
(45) Date of Patent: Jul. 24, 2007

(54) ELECTRO-MAGNETIC SUPPRESSIVE STRUCTURE

(75) Inventors: Michael Brooks, Sacramento, CA (US); Mike Cherniski, Rescue, CA (US); Kevin Smith, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/387,800

(22) Filed: Mar. 12, 2003

(65) Prior Publication Data
US 2004/0179346 A1 Sep. 16, 2004

(51) Int. Cl.
*H05K 9/00* (2006.01)

(52) U.S. Cl. .................. 361/818; 361/816; 174/51

(58) Field of Classification Search ........... 361/816, 361/818, 714, 800; 174/52.4, 35 R, 51 R, 174/35, 35 MS, 51, 52.2, 52; 29/827; 438/796; 455/558

See application file for complete search history.

(56) References Cited

U.S. PATENT DOCUMENTS

| | | | | |
|---|---|---|---|---|
| 4,769,345 A | * | 9/1988 | Butt et al. | 29/827 |
| 4,804,490 A | * | 2/1989 | Pryor et al. | 438/796 |
| 5,317,478 A | * | 5/1994 | Sobhani | 361/689 |
| 5,557,064 A | * | 9/1996 | Isern-Flecha et al. | 174/35 MS |
| 5,566,055 A | * | 10/1996 | Salvi, Jr. | 361/816 |
| 5,763,824 A | * | 6/1998 | King et al. | 174/35 R |
| 5,894,597 A | * | 4/1999 | Schwartz et al. | 455/558 |
| 6,109,530 A | * | 8/2000 | Larson et al. | 235/492 |
| 6,178,318 B1 | * | 1/2001 | Holmberg et al. | 455/300 |
| 6,489,558 B1 | * | 12/2002 | Baba et al. | 174/52.4 |
| 6,674,652 B2 | * | 1/2004 | Forte et al. | 361/800 |

* cited by examiner

*Primary Examiner*—Tuan Dinh
*Assistant Examiner*—Hung S. Bui (57) ABSTRACT

Embodiments of the present invention provide an electro-magnetic suppressive structure. The electro-magnetic suppressive structure comprises a cover portion and an integrally formed conductive portion.

17 Claims, 6 Drawing Sheets

ELECTRO-MAGNETIC SUPPRESSIVE
STRUCTURE

FIELD OF THE INVENTION

Embodiments of the present invention relate to electro-magnetic interference suppression, and more particularly to an electro-magnetic interference image plane integrally formed about a cover.

BACKGROUND OF THE INVENTION

Figure 1:
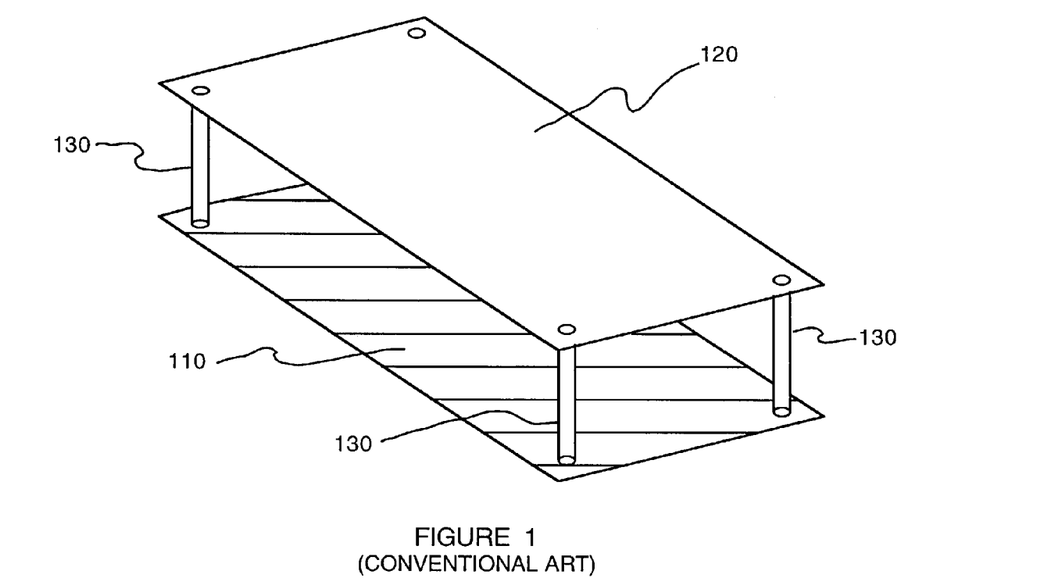
FIG. 1 shows an electro-magnetic interference (EMI) image plane 110 according to the conventional art.

Referring to FIG. 1, an electro-magnetic interference (EMI) image plane 110 according to the conventional art is shown. The EMI image plane acts to suppress EMI emission from a source such as a printed circuit assembly (PCA) 120. As depicted in FIG. 1, the EMI image plane 110 comprises a conductive layer orientated in close proximity to the PCA 120. Furthermore, the EMI image plane 110 is electrically isolated from the PCA 120. In one implementation, the EMI image plane 110 is coupled to the PCA 120 by a plurality of insulating spacer hardware 130.

The EMI image plane 110 works by creating an image of local noise currents that are opposite to source noise currents in the PCA. The absence of a ground connection between the EMI image plane 110 and the PCA 120 allows image currents to remain local to their source energy and provide effective cancellation of magnetic flux. Thus, the net noise energy, radiating from a PCA 120 is reduced.

The image plane provides relatively good suppression of EMI energy radiated by the PCA 120 beyond the EMI image plane 110. However, the EMI image plane 110 can acquire a static charge, relative to the PCA 120, because it is electrically isolated from the PCA 120. When the static charge builds up to a sufficient level it typically discharges through the PCA 120 because of its close proximity thereto. Such a discharge regularly causes damage to the electrical components on the PCA 120.

Figure 2:
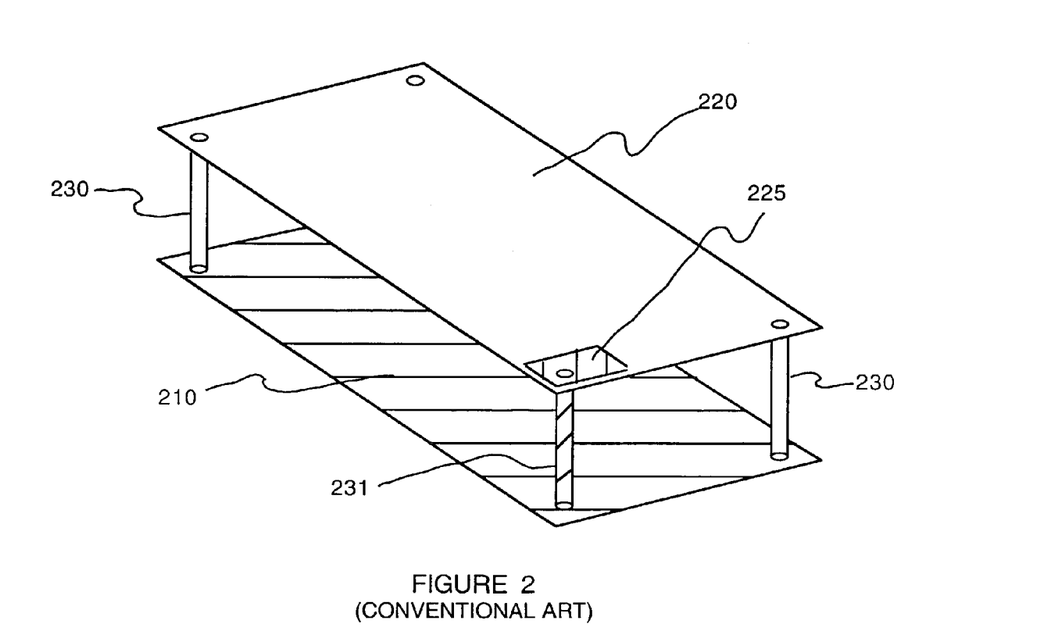
FIG. 2 shows an electro-magnetic interference (EMI) shield 210 according to the conventional art.

Referring to FIG. 2, an electro-magnetic interference (EMI) shield 210 according to the conventional art is shown. The EMI shield 210 acts to suppress EMI emission from a source, such as a printed circuit assembly (PCA) 220. As depicted in FIG. 2, the EMI shield 210 is orientated in close proximity to the PCA 220 by a plurality of spacer hardware 330, 331. In one implementation, one of the spacers 331 is electrically conductive and is utilized to couple the EMI shield to a ground 225 of the PCA 220. The connection 331 to ground 225 provides a low impedance path.

The EMI shield 210 works by draining the EMI energy radiated by the PCA 220 to ground. Furthermore, the EMI shield 210 does not acquire a static charge because it is grounded to the PCA 220. Thus, damage resulting from electrostatic discharge is reduced. However, the EMI shield 210 provides relatively poor suppression of EMI radiation (with respect to an EMI image plane).

Figure 3:
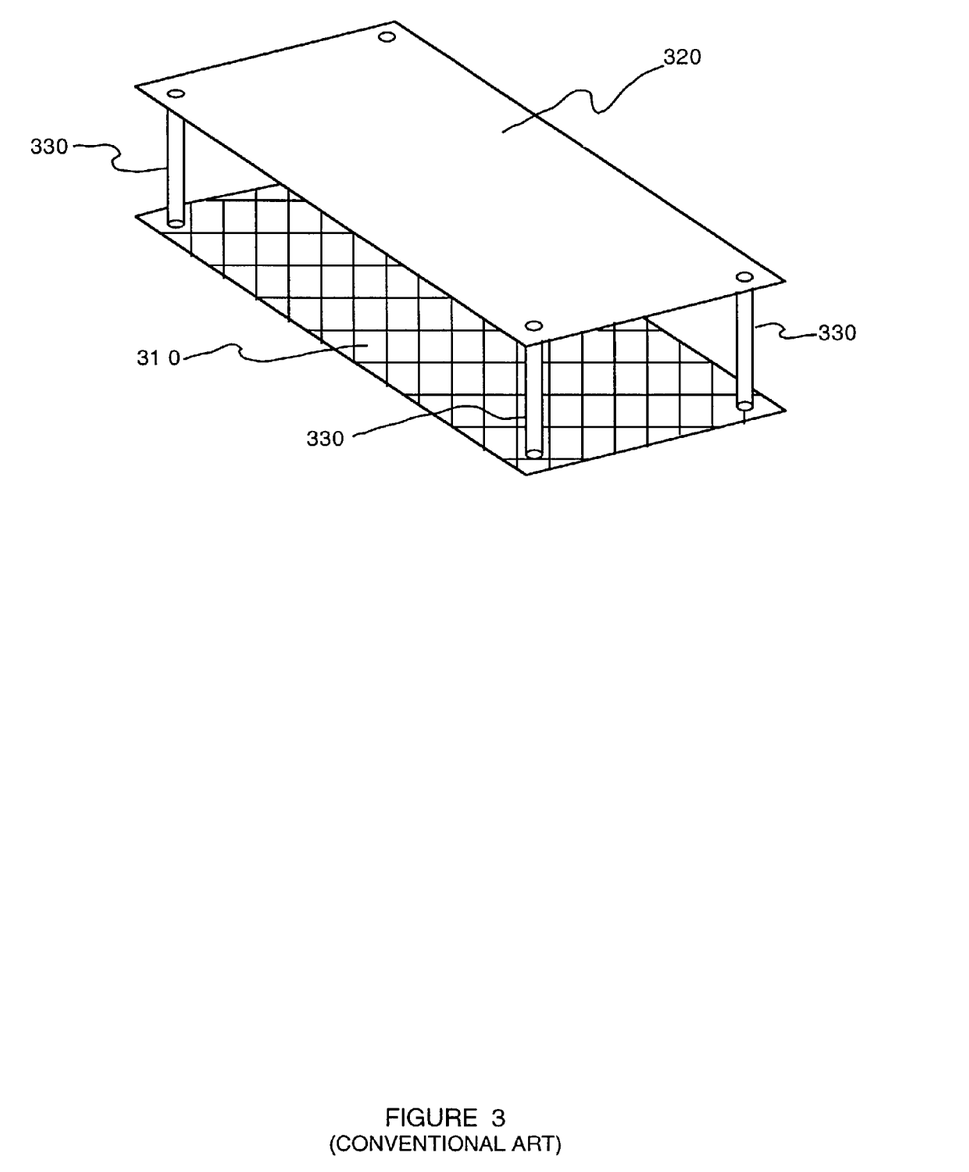
FIG. 3 shows a cover according to the conventional art.

Referring now to FIG. 3 a cover 310 according to the conventional art is shown. As depicted in FIG. 3, the cover 310 is non-conductive and orientated in close proximity to the PCA 320. In one implementation, the cover 310 is coupled to the PCA 320 by a plurality of insulating spacer hardware 330.

The cover 310 may comprise a front-side (component) cover and/or a backside (solder-side) cover. The cover 310 is utilized to prevent mechanical and/or electrical damage to assemblies and/or components due to electrical shorting, electrostatic discharge, improper insertion or extraction, as well as during handling, and regular PCA operation. Furthermore, the use of one or more covers 310 substantially increases the dimensions of the assembly.

Thus, a need exists for an improved method of reducing EMI emission from a source. The method and apparatus should provide protection to adjacent devices from electrostatic discharge, shorting, mechanical damage and the like. The method and apparatus should also be relatively inexpensive. The method and apparatus should also be relatively compact. The present invention provides a novel solution to the above needs.

SUMMARY OF THE INVENTION

Embodiments of the present invention provide an electro-magnetic suppressive structure. In one embodiment, the electro-magnetic suppressive structure comprises a cover portion and an integrally formed conductive portion.

BRIEF DESCRIPTION OF THE DRAWINGS

The present invention is illustrated by way of example and not by way of limitation, in the figures of the accompanying drawings and in which like reference numerals refer to similar elements and in which.

Prior Art

Prior Art

Prior Art

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 4:
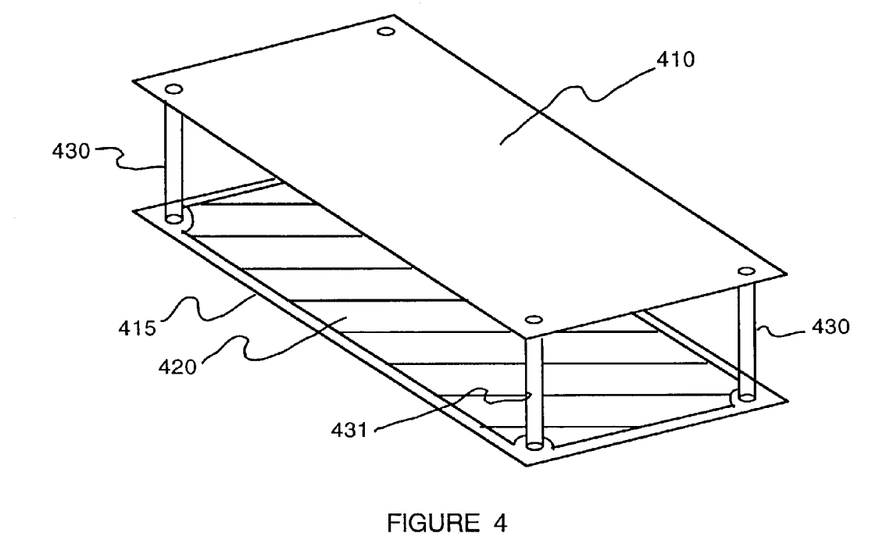
FIG. 4 shows an integral cover and electro-magnetic interference (EMI) image plane, in accordance with one embodiment of the present invention.

Referring now to FIG. 4, an integral cover and electromagnetic interference (EMI) image plane, in accordance with one embodiment of the present invention, is shown. As depicted in FIG. 4, the integral cover and EMI image plane comprises a cover portion 415 and a conductive portion 420.

The integral cover and EMI image plane is orientated within close proximity to a source of EMI emission, such as a printed circuit assembly (PCA) or the like 410. In one embodiment, the integral cover and EMI image plane is coupled to the PCA 410 by electrically insulative hardware 430, such as standoffs, screws, rivets, or another similar well-known in the art method.

In one embodiment, the conductive portion 420 is affixed to the side of the cover portion 415 that faces the PCA 410. The cover portion 415 may be either constructed from a non-conductive material and/or isolated from ground. In another embodiment, the conductive portion 420 is affixed to the side of the cover portion 415 that faces away from the PCA 410. The cover portion 415 may comprise a front-side (component) cover and/or a backside (solder-side) cover. In one embodiment, the cover portion 415 may be formed by a thermoform process, an injection molding process, or other similar process well known in the art. In one embodiment, the cover portion 415 is formed from an electrostatic discharge (ESD) type plastic. The ESD type plastic resists the buildup of electrostatic charge thereon.

In one embodiment, the conductive portion 420 is formed by selectively depositing a conductive thin film of metal upon the cover portion 415. The conductive thin film may be deposited by a process such as sputtering or other similar process well known in the art. In another embodiment, the conductive portion comprises a patterned conductive sheet affixed to the cover portion 415 by an adhesive, rivets, screws, and/or other similar method well known in the art. In another embodiment, the integral cover and EMI image plane may be formed by sandwiching a conductive sheet or film between two pieces of the cover portion 415. In yet another embodiment, the conductive portion 420 comprises a conductive film or sheet, which is affixed to the cover portion 415. A thin insulative film, such as paint, a label or the like, is affixed to the conductive film or sheet opposite the cover portion 415.

The EMI image plane provided by the conductive portion 420 works by creating an image of local noise currents that are opposite to source noise currents in the PCA 410. Thus, the net noise energy, radiating from a particular region of a PCA 410 is reduced. The absence of a ground connection between the conductive portion 420 and the PCA 410 allows image currents to remain local to their source energy and provide effective cancellation of magnetic flux.

Hence, the conductive portion 420 reduces EMI emission from the PCA 410. The conductive portion 420 also protects the PCA 410 against electrostatic discharge. The cover portion 415 protects the PCA 410 against physical and/or electrical damage during operation and/or handling of the PCA 410. The integration of the cover portion 415 and the conductive portion 420 also provides a compact assembly, which satisfies the dimensional constraints imposed by the next generation of blade chassis and the like.

Figure 5:
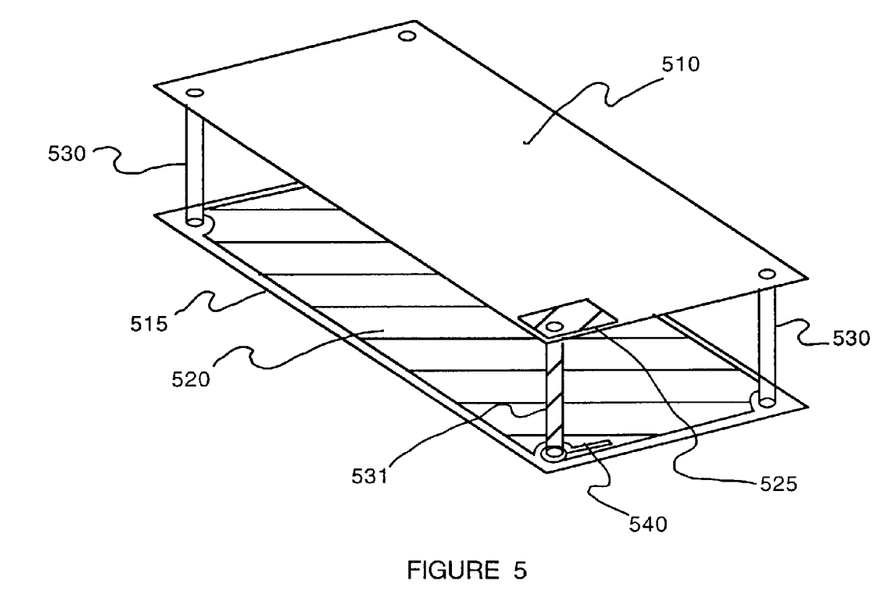
FIG. 5 shows an integral cover and electro-magnetic interference (EMI) image plane, in accordance with one embodiment of the present invention.

Referring now to FIG. 5, an integral cover and electromagnetic interference (EMI) image plane, in accordance with one embodiment of the present invention, is shown. As depicted in FIG. 5, the integral cover and EMI image plane comprises a cover portion 515 and a conductive portion 520.

The integral cover and EMI image plane is orientated within close proximity to a source of EMI emission, such as a printed circuit assembly (PCA) or the like 510. In one embodiment, the integral cover and EMI image plane is coupled to the PCA 510 by hardware 530, 531 such as standoffs, screws, rivets, or another similar method well known in the art.

In one embodiment, the conductive portion 520 is affixed to the side of the cover portion 515 that faces the PCA 510. In another embodiment, the conductive portion 520 is affixed to the side of the cover portion, which faces away from the PCA 510. The cover portion 515 may comprise a front-side (component) cover and/or a backside (solder-side) cover. In one embodiment, the cover portion 515 may be formed by a thermoform process, an injection molding process, or other similar process well known in the art.

In one embodiment, the conductive portion 520 is formed by selectively depositing a conductive thin film upon the cover portion 515. The conductive thin film may be deposited by a process such as sputtering or other similar process well known in the art. In another embodiment, the conductive portion 520 comprises a patterned conductive sheet affixed to the cover portion 515 by an adhesive, rivets, screws, and/or other similar method well known in the art. In yet another embodiment, the integral cover and EMI image plane may be formed by sandwiching a conductive film or sheet between two pieces of the cover portion 515. In yet another embodiment, the conductive portion 520 comprises a conductive film or sheet, which is affixed to the cover portion 515. A thin insulative film, such as paint, a label or the like, is affixed to the conductive film or sheet opposite the cover portion 515.

The conductive portion 520 comprises a planar portion and an elongated portion (e.g., trace-like) 540. The elongated portion 540 provides a high inductive connection (relative to the EMI shield according to the conventional art) for time varying currents (e.g., magnetic flux induced current on the conductive portion), and a resistive connection for substantially non-time varying currents (e.g., accumulation of electrostatic charge on the conductive portion). For a given frequency of interest, the inductive property increases as the aspect ratio (length divided by width) of the elongated portion 540 increases. In one embodiment, the inductive element is provided by the elongated portion 540 having an aspect ratio of approximately five to one (5:1) or more. In an exemplary embodiment, the aspect ration is approximately ten to one (10:1). In one embodiment, the resistive element should be between 5 ohms to 1 Mega-ohms or more. However, the resistive element is generally determined by the method utilized to form the conductive portion 520 such that the elongated portion 540 has a consistent and uniform resistive value. In one embodiment, the elongated portion 540 may be electrically coupled to the PCA 510 by an electrically conductive hardware element 531.

The EMI image plane provided by the conductive portion 520 works by creating an image of local noise currents that are opposite to source noise currents on the PCA 510. The high inductive connection allows image currents to remain local to their source energy and provide effective cancellation of magnetic flux radiating from the PCA 510. The resistive connection allows discharge of electrostatic charge from the cover portion 515 and conductive portion 520.

Thus, the conductive portion 520 reduces EMI emission from the PCA or the like 510. The conductive portion 520 also protects the PCA or the like 510 against electrostatic discharge. The cover portion 515 protects the PCA or the like 510 against physical and/or electrical damage during operation and/or handling of the PCA or the like 510. The integration of the cover and EMI image plane also provides a compact assembly which satisfies the dimensional constraints imposed by the next generation of blade chassis and the like.

Figure 6A:
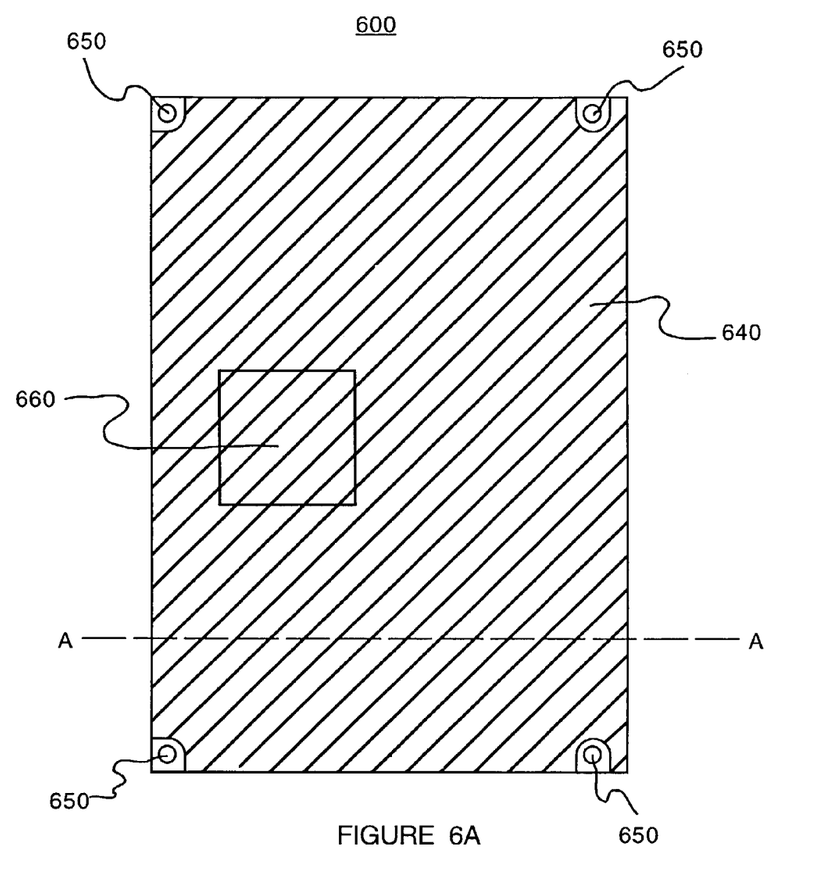
FIGS. 6A–6C show an integral cover and electro-magnetic interference (EMI) image plane, in accordance with one embodiment of the present invention.
Figure 6B:
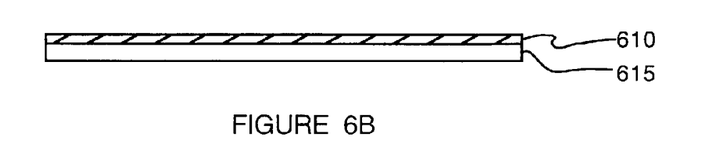
Figure 6C:
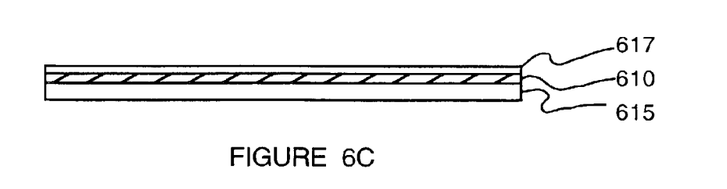

Referring now to FIGS. 6A–6C, a protective structure providing an integral cover and electro-magnetic interference (EMI) image plane, in accordance with one embodiment of the present invention, is shown. FIG. 6A is a top view of the integral cover and EMI image plane. FIG. 6B is a side section view of the integral cover and EMI image plane. FIG. 6C is a side section view of the integral cover and EMI image plane according to another implementation. As depicted in FIGS. 6A and 6B, the integral cover and EMI image plane comprises a cover portion 615 and a conductive portion 610. The integral cover and EMI image plane is utilized to prevent mechanical and/or electrical damage to printed circuit assemblies (PCA), components, and/or the like due to electrical shorting, electrostatic discharge, improper insertion or extraction, as well as during handling and regular operation thereof.

The cover portion 615 may comprise a thermoformed sheet of plastic, injection molded plastic, or the like. In one implementation, the plastic is an electrostatic discharge (ESD) type plastic. The ESD type plastic resists the buildup of electrostatic charge thereon. The cover portion 615 is formed having dimensions and characteristics which are in compliance with an industry standard, such as the compact peripheral component interconnect (CPCI) standard, the VersaModular Eurocard (VME) standard, the network equipment building systems (NEBS) standard, or the like.

The cover portion 615 further comprises attaching portions 650 for coupling the integral cover and EMI image plane 600 to a PCA or the like. In one embodiment, the attaching portions 650 comprise a plurality of holes spaced about the integral cover and EMI image plane 600. In one embodiment, hardware such as rivets, screws, snaps or the like may be utilized to couple the integral cover and EMI image plane 600 to the PCA via the attaching portions 650. The attaching portions 650 and or hardware may provide for removably-coupling the integral cover and EMI image plane 600 to the PCA.

The integral cover and EMI image plane 600 may optionally include one or more openable portions 660, such as a window portion, sliding portion, removable portion and/or the like. The openable portion 660 provides for selectively exposing components underlying the integral cover and EMI image plane 600, such that it does not need to be removed to service parts on the PCA 610. In an exemplary embodiment, the openable portion 660 comprises a window portion attached via a living hinge. The living hinge comprises several compound curvatures (or bends). As each bend moves slightly, the sum of the individual bends will move enough to allow the openable portion 660 to pivot a desired amount. The amount of bending required by each compound curvature is kept within the acceptable limit of the plastic such that it will not break or crack. Thus, each bend only needs to move a few degrees but the openable portion 660 will move the desired amount to gain access to the components thereunder. The integral cover and EMI image plane 600 may also include retaining means such as tuck slots and receiving bulkhead or the like for retaining the openable portion 660 in a closed position when desired.

In one embodiment, the conductive portion 610 is formed by selectively depositing a thin film of metal such as aluminum upon the cover portion 615. The thin film of metal may be deposited by a process such as sputtering or the like. In another embodiment, a metal sheet is affixed to the cover portion 615 by an adhesive, hardware and/or the like. In yet another embodiment, the integral cover and EMI image plane 600 may comprise a thin film or sheet of metal sandwiched between two pieces of plastic, as depicted in FIG. 6C. In yet another embodiment, the conductive portion 620 comprises a metal film or sheet, which is affixed to the cover portion 615. A thin insulative film, such as paint, a label or the like, is affixed to the metal film or sheet opposite the cover portion 615.

The EMI image plane provided by the conductive portion 610 works by creating an image of local noise currents that are opposite to source noise currents. The absence of a ground connection between the EMI image plane and the PCA allows image currents to remain local to their source energy and provide effective cancellation of radiated EMI.

Figure 7A:
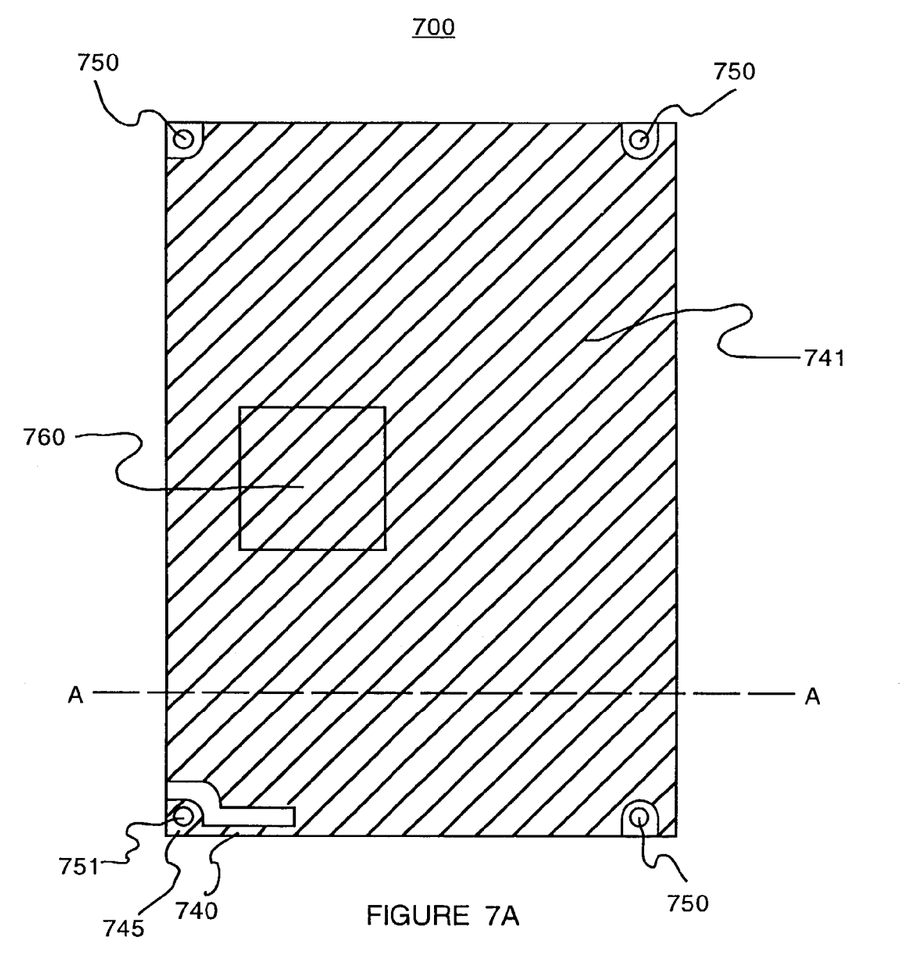
FIGS. 7A and 7B show an integral cover and electro-magnetic interference (EMI) image plane, in accordance with one embodiment of the present invention.
Figure 7B:
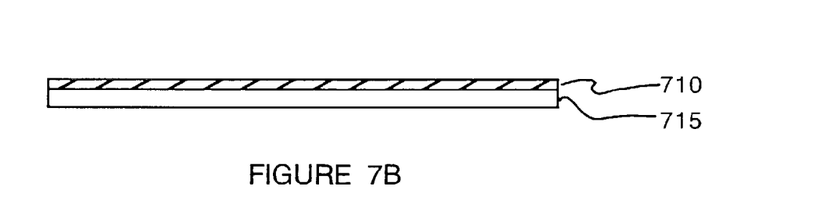

Referring now to FIGS. 7A and 7B, a protective structure providing an integral cover and electro-magnetic interference (EMI) image plane, in accordance with one embodiment of the present invention, is shown. FIG. 7A is a top view of the integral cover and EMI image plane. FIG. 7B is a side section view of the integral cover and EMI image plane. As depicted in FIGS. 7A and 7B, the integral cover and EMI image plane comprises a cover portion 715 and a conductive portion 710. The integral cover and EMI image plane is utilized to prevent mechanical and/or electrical damage to PCAS, assemblies, components, and/or the like due to electrical shorting, electrostatic discharge, improper insertion or extraction, as well as during handling and regular operation thereof.

The cover portion 715 may comprise a thermoformed sheet of plastic, injection molded plastic, or the like. The cover portion 715 is formed having dimensions and characteristics which are in compliance with an industry standard, such as the compact peripheral component interconnect (CPCI) standard, the VersaModular Eurocard (VME) standard, the network equipment building systems (NEBS) standard, or the like.

The cover portion 715 further comprises attaching portions 750, 751 for coupling the integral cover and EMI image plane 700 to a PCA or the like. In one embodiment, the attaching portions 750, 751 comprise a plurality of holes spaced about the integral cover and EMI image plane 700. In one embodiment, hardware such as rivets, screws, snaps or the like may be utilized to couple the integral cover and EMI image plane 700 to the PCA via the attaching portions 750, 751. The attaching portions 750, 751 and or hardware may provide for removably-coupling the integral cover and EMI image plane 700 to the PCA.

The cover portion 715 may optionally include one or more openable portions 760, such as a window portion, sliding portion, removable portion and/or the like. The openable portion 760 provides for selectively exposing components underlying the cover portion 715, such that the cover does not need to be removed to service parts on a PCA or the like. In an exemplary embodiment, the openable portion 760 comprises a window portion attached via a living hinge. The living hinge comprises several compound curvatures (or bends). As each bend moves slightly, the sum of the individual bends will move enough to allow the openable portion 760 to pivot a desired amount. The amount of bending required by each compound curvature is kept within the acceptable limit of the plastic such that it will not break or crack. Thus, each bend only needs to move a few degrees but the openable portion 760 will move the desired amount to gain access to the components thereunder. The integral cover and EMI image plane 700 may also include retaining means such as tuck slots and receiving bulkhead or the like for retaining the openable portion 760 in a closed position when desired.

In one embodiment, the conductive portion 710 is formed by selectively depositing a thin film of metal such as aluminum upon the cover portion 715. The thin film of metal may be deposited by a process such as sputtering or the like. In another embodiment, the conductive portion 710 comprises a patterned metal sheet, which is affixed to the cover portion 715 by an adhesive, hardware and/or the like. In another embodiment, the integral cover and EMI image plane 700 comprises a metal film or sheet, which is sandwiched between two pieces of the cover portion 715, 717. In yet another embodiment, the conductive portion 710 comprises a metal film or sheet, which is affixed to the cover portion 715. A thin insulative film, such as paint, label or the like, is affixed to the metal film or sheet opposite the cover portion 715.

The conductive portion 710 comprises a planar portion 741 and an elongated portion (e.g., trace-like) 740. The elongated portion 740 provides a high impedance connection. The impedance of the connection is related to the aspect ratio of the elongated portion 740. In an exemplary embodiment, the aspect ratio is selected such that the length of the elongated portion 740 is approximately ten times greater then the width thereof. Hence, the elongated portion 740 comprises a connection for time varying signals that provides a high inductive connection to the PCA. The elongated portion 740 further comprises a connection for substantially non-time varying signals that provides a resistive connection to the PCA.

The planar portion works by creating an image of local noise currents that are opposite to source noise currents. The high impedance (relative to the EMI shield according to the conventional art) of the elongated portion 740 allows image currents to remain local to their source energy and thereby provide effective cancellation of the magnetic flux. The elongated portion 740 also provides the resistive discharge path for electrostatic charge that may accumulate on the integral cover and EMI image plane 700.

In one embodiment, a contact pad 745 is formed about the one attaching portion 751. The elongated portion 740 is terminated at the contact pad 745. The contact pad 745 formed about the one attaching portion 751 can therefore provide a connection to a ground of a PCA 710 via a conductive hardware element.

Figure 8:
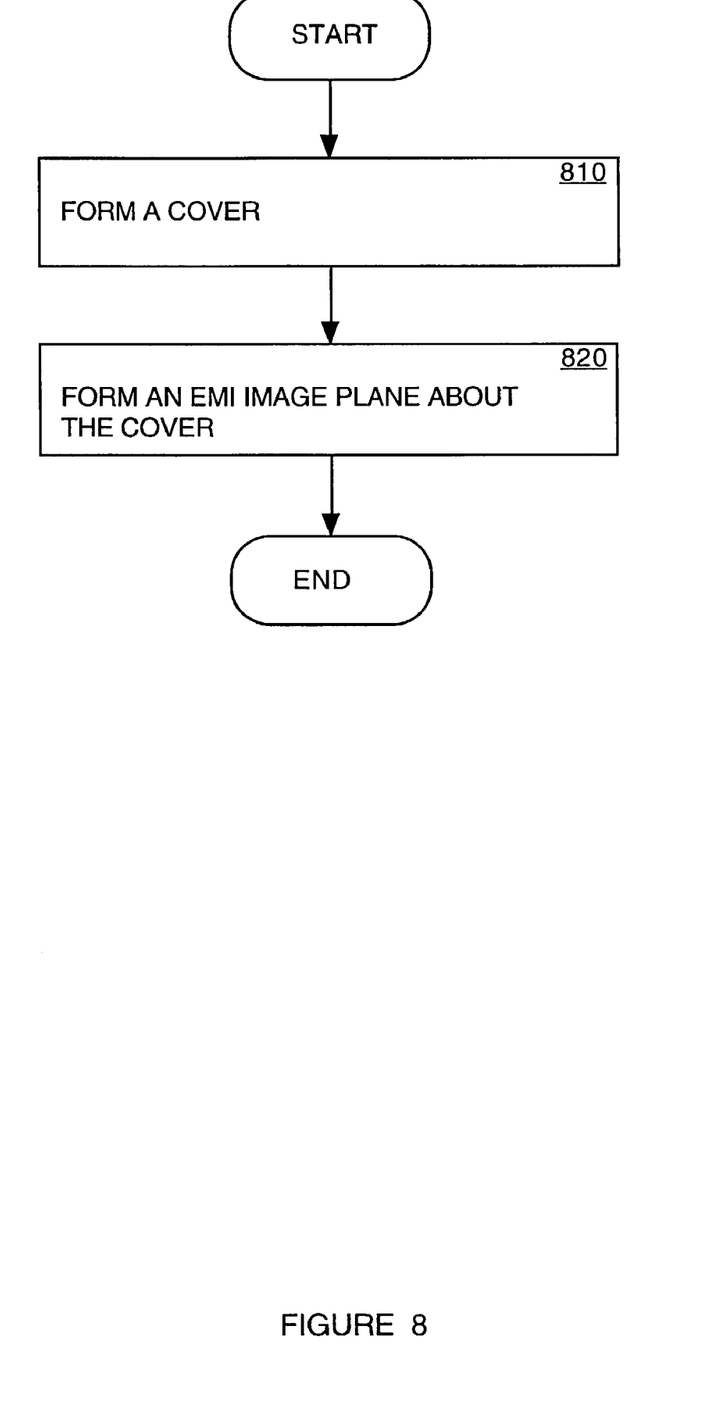
FIG. 8 shows a process for forming an integral cover and electro-magnetic interference (EMI) image plane, in accordance with one embodiment of the present invention.

Referring now to FIG. 8, a process for forming an integral cover and electro-magnetic interference (EMI) image plane, in accordance with one embodiment of the present invention, is shown. As depicted in FIG. 8, the process comprises forming a cover at step 810. The cover portion is formed having attaching portions for coupling the cover to a printed circuit assembly (PCA) or the like. In an exemplary embodiment, the attaching portions comprise a plurality of holes spaced about the cover. The attaching portions may provide for removably-coupling the integral cover and EMI image plane to the PCA.

The cover may comprise a thermoformed sheet of plastic, injection molded plastic, or the like. The cover is formed having dimensions and characteristics which are in compliance with an industry standard, such as the compact peripheral component interconnect (CPCI) standard, the VersaModular Eurocard (VME) standard, the network equipment building systems (NEBS) standard, or the like. In an exemplary embodiment, the cover may be a solder side cover or the like.

The cover may optionally include one or more openable portions, such as a window portion, sliding portion, removable portion and/or the like. The openable portion provides for selectively exposing components underlying the integral cover and EMI image plane, such that it does not need to be removed to service parts on a PCA or the like.

The process further comprises forming an electro-magnetic interference (EMI) image plane about the cover, at step 820. In one embodiment, the metal layer is formed by depositing a thin film of metal, such as aluminum, upon the cover. The thin film of metal may be deposited by a process such as sputtering or other similar process well known in the art. In another embodiment, a metal sheet is affixed to the cover by an adhesive, hardware and/or the like. In yet another embodiment, the integral cover and EMI image plane may comprise a thin film or sheet of metal sandwiched between two pieces of plastic. In yet another embodiment, the cover is affixed to the top of a metal layer, and an insulative film such as paint, label, or the like is applied to the bottom of the metal layer. The thin insulative film should be sufficient to prevent metal conductors such as pins on the PCA from poking through it to the EMI image plane portion.

In an optional embodiment, the EMI image plane comprises a planar portion and an elongated portion (e.g., trace-like). The elongated portion provides the high impedance connection (relative to the EMI image plane of according to the conventional art). The planar portion works by creating an image of local noise currents that are opposite to source noise currents. The high impedance (relative to the EMI shield according to the prior art) of the elongated portion allows image currents to remain local to their source energy and thereby provide effective cancellation of radiated magnetic flux. The elongated portion also provides a discharge path for electrostatic charge, which may accumulate on the metal layer. In one embodiment, the elongated portion may be electrically coupled to a PCA or the like by an electrically conductive attaching portion and/or conductive hardware element.

In another embodiment, where a high impedance connection is not provided, the cover is comprised of an electrostatic discharge (ESD) type plastic. The ESD type plastic resists the build up of static electric charge thereupon. In an exemplary embodiment, the metal layer is formed between two layers of ESC plastic. Hence, the ESD type plastic protects adjacent assemblies, components, and the like against damage due to electrostatic discharge from the integral cover and EMI image plane.

The EMI image plane, in accordance with embodiments of the present invention, provides improved suppression of EMI energy radiated by the PCA beyond the EMI image plane. Furthermore, the EMI image plane does not acquire a static charge. The cover also advantageously reduces damage to components located on the PCA. One or more windows in the integral EMI image plane cover assembly also advantageously allows access to serviceable or replaceable components without removal of the cover. The one or more windows also advantageously reduce the time needed to access serviceable or replaceable components. The cover with integrated EMI image plane advantageously provides a very compact assembly. The cover with integrated EMI image plane is also relatively inexpensive. Finally, embodiments of the present invention can be readily adapted to interface with industry standard components and meet industry standard specifications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electro-magnetic suppressive structure comprising:
   a cover portion for protecting a printed circuit assembly (PCA) against physical damage during handling, said cover portion comprising an openable portion for selectively exposing components underlying the cover, wherein said cover portion is coupled to the PCA by electrically insulative hardware; and
   a conductive plane portion integrally formed about said cover portion for protecting a printed circuit assembly (PCA) against electrical damage during operation by forming an electro-magnetic interference (EMI) image plane, wherein said conductive plane portion is a plane regardless of the surface it is covering, said conductive portion comprising;
      an openable portion;
      a plane portion; and
      an elongated portion electrically coupled to said plane portion, said elongated portion comprising an inductive connection for a time varying signal on said conductive portion.

2. The electro-magnetic suppressive structure according to claim 1, wherein said conductive portion integrally formed about said cover portion comprises a conductive film deposited on said cover portion.

3. The electro-magnetic suppressive structure according to claim 1, wherein said conductive portion integrally formed about said cover comprises a conductive sheet sandwiched between a plurality of pieces of said cover portion.

4. The electro-magnetic suppressive structure according to claim 1, wherein said conductive portion integrally formed about said cover comprises a conductive sheet affixed to said cover portion.

5. The electro-magnetic suppressive structure according to claim 1, wherein said cover portion comprises an electrostatic discharge (ESD) type plastic.

6. The electro-magnetic suppressive structure according to claim 1, wherein said cover portion comprises a solder-side cover.

7. The electro-magnetic suppressive structure according to claim 1, wherein said cover portion comprises a plurality of attaching portions.

8. The electro-magnetic suppressive structure according to claim 1, wherein said elongated portion is adapted to electrically couple said plane portion to a source of electro-magnetic interference.

9. The electro-magnetic suppressive structure according to claim 1, wherein a length of said elongated portion is approximately 5–10 time greater than a width of said elongated portion.

10. An electro-magnetic suppressive structure comprising:
    a cover portion for protecting a printed circuit assembly (PCA) against physical damage during handling, said cover portion comprising an openable portion for selectively exposing components underlying the cover, wherein said cover portion is coupled to the PCA by electrically insulative hardware; and
    a conductive plane portion integrally formed about said cover portion for protecting a printed circuit assembly (PCA) against electrical damage during operation by forming an electro-magnetic interference (EMI) image plane, wherein said conductive plane portion is a plane regardless of the surface it is covering, said conductive portion comprising;
       an openable portion;
       a plane portion; and
       an elongated portion electrically coupled to said plane portion,
          said elongated portion comprising a resistive connection for a substantially non-time varying signal on said conductive portion.

11. The electro-magnetic suppressive structure according to claim 10, wherein said conductive portion integrally formed about said cover portion comprises a conductive film deposited on said cover portion.

12. The electro-magnetic suppressive structure according to claim 10, wherein said conductive portion integrally formed about said cover comprises a conductive sheet sandwiched between a plurality of pieces of said cover portion.

13. The electro-magnetic suppressive structure according to claim 10, wherein said conductive portion integrally formed about said cover comprises a conductive sheet affixed to said cover portion.

14. The electro-magnetic suppressive structure according to claim 10 wherein said elongated portion is adapted to electrically couple said plane portion to a source of electro-magnetic interference.

15. An electro-magnetic suppressive structure comprising:
    a cover portion for protecting a printed circuit assembly (PCA) against physical damage during handling, said cover portion comprising an openable portion for selectively exposing components underlying the cover, wherein said cover portion is coupled to the PCA by electrically insulative hardware; and
    a conductive plane portion integrally formed about said cover portion for protecting a printed circuit assembly (PCA) against electrical damage during operation by forming an electro-magnetic interference (EMI) image plane, wherein said conductive plane portion is a plane regardless of the surface it is covering, said conductive portion comprising;
       an openable portion;
       a plane portion; and
       an elongated portion electrically coupled to said plane portion, said elongated portion is adapted to electrically couple said plane portion to a source of electro-magnetic interference.

16. The electro-magnetic suppressive structure according to claim 15, wherein said conductive portion integrally formed about said cover portion comprises a conductive film deposited on said cover portion.

17. The electro-magnetic suppressive structure according to claim 15, wherein said conductive portion integrally formed about said cover comprises a conductive sheet sandwiched between a plurality of pieces of said cover portion.

* * * * *